(12) United States Patent
Yamamoto et al.

(10) Patent No.: US 9,797,046 B2
(45) Date of Patent: Oct. 24, 2017

(54) METHOD FOR ETCHING METAL OR METAL OXIDE BY OZONE WATER, METHOD FOR SMOOTHING SURFACE OF METAL OR METAL OXIDE BY OZONE WATER, AND PATTERNING METHOD USING OZONE WATER

(71) Applicant: Japan Science and Technology Agency, Kawaguchi-shi, Saitama (JP)

(72) Inventors: Takatoki Yamamoto, Tokyo (JP); Ryuji Hatsuki, Tokyo (JP)

(73) Assignee: JAPAN SCIENCE AND TECHNOLOGY AGENCY, Kawaguchi-Shi (JP)

( * ) Notice: Subject to any disclaimer, the term of this patent is extended or adjusted under 35 U.S.C. 154(b) by 0 days.

(21) Appl. No.: 14/396,462

(22) PCT Filed: Apr. 25, 2013

(86) PCT No.: PCT/JP2013/062261
§ 371 (c)(1),
(2) Date: Oct. 23, 2014

(87) PCT Pub. No.: WO2013/161959
PCT Pub. Date: Oct. 31, 2013

(65) Prior Publication Data
US 2015/0129543 A1  May 14, 2015

(30) Foreign Application Priority Data
Apr. 27, 2012 (JP) ................................ 2012-103285

(51) Int. Cl.
*H01L 21/302* (2006.01)
*C23F 1/02* (2006.01)
(Continued)

(52) U.S. Cl.
CPC ................ *C23F 1/02* (2013.01); *C09K 13/00* (2013.01); *C23F 1/16* (2013.01); *C23F 3/03* (2013.01);
(Continued)

(58) Field of Classification Search
CPC ...... C23F 1/02; C23F 1/10; C23F 1/16; C23F 1/14; C23F 1/26; C23F 1/00; G03F 7/004;
(Continued)

(56) References Cited

U.S. PATENT DOCUMENTS 6,531,047 B1    3/2003  Kato et al.
8,283,259 B2 *  10/2012 Sapra et al. .................. 438/754
(Continued)

FOREIGN PATENT DOCUMENTS

JP    2000-164552 A    6/2000
JP    2000-173957 A    6/2000
(Continued)

OTHER PUBLICATIONS

The International Bureau of WIPO, "Notification of Transmittal of Translation of the International Preliminary Report on Patentability," issued in International Application No. PCT/JP2013/062261, of which U.S. Appl. No. 14/396,462 is a U.S. national phase entry, with a date of mailing of Nov. 6, 2014.

(Continued)

*Primary Examiner* — Lan Vinh

(57) ABSTRACT

Provided are a method for etching a metal or metal oxide without using a reagent, etc., that affects the environment, a method for smoothing a surface of a metal or metal oxide on an atomic level, and a method for patterning on an atomic level. Etching of a metal or metal oxide, or smoothing of a surface of a metal or metal oxide is possible using ozone water in which only ozone is dissolved. Patterning can also (Continued)

be performed by providing a metal that does not dissolve in the ozone water as a resist on a metal or metal oxide that can be etched by ozone water in which only ozone is dissolved, and etching using the ozone water.

6 Claims, 15 Drawing Sheets

(51) Int. Cl.
H01L 21/3213 (2006.01)
C09K 13/00 (2006.01)
C23F 1/16 (2006.01)
C23F 3/03 (2006.01)
C23F 3/06 (2006.01)

(52) U.S. Cl.
CPC .......... *C23F 3/06* (2013.01); *H01L 21/32134* (2013.01)

(58) Field of Classification Search
CPC ........ G03F 7/0046; G03F 7/0048; G03F 7/00; H01L 21/027; H01L 21/0271
USPC .... 216/86, 87, 101, 102, 107; 438/745, 754, 438/770
See application file for complete search history.

(56) References Cited

U.S. PATENT DOCUMENTS

| | | | |
|---|---|---|---|
| 8,337,710 B2* | 12/2012 | Takeuchi | C02F 1/78 210/760 |
| 9,040,318 B2* | 5/2015 | Loo | B82Y 10/00 438/19 |
| 2002/0030021 A1* | 3/2002 | Pappa | C02F 1/725 210/748.14 |
| 2002/0164887 A1 | 11/2002 | Tomita et al. | |
| 2003/0107690 A1* | 6/2003 | Nishiki | G02F 1/133553 349/113 |
| 2004/0166675 A1* | 8/2004 | Kwon | 438/687 |
| 2005/0133067 A1* | 6/2005 | Bergman | 134/26 |
| 2006/0283837 A1* | 12/2006 | Shea | H01L 28/92 216/83 |

FOREIGN PATENT DOCUMENTS

| | | |
|---|---|---|
| JP | 2000-188278 A | 7/2000 |
| JP | 2001-035827 A | 2/2001 |
| JP | 2001-043528 A | 2/2001 |
| JP | 2002-038282 A | 2/2002 |
| JP | 2004-235316 A | 8/2004 |
| JP | 2005-270830 A | 10/2005 |
| JP | 2006-286661 A | 10/2006 |
| WO | 01/05702 A1 | 1/2001 |

OTHER PUBLICATIONS

Amir Azarpazhooh et al., "The application of ozone in dentistry: A systematic review of literature", Journal of Dentistry, 36, 2008, pp. 104-116.

Okiharu Kirino et al., "Development of Abrasive-Free Polishing Method for Cu Utilizing Vacuum Ultra-Violet Light", Transactions of the JSME, vol. 74, No. 742, Jun. 2008, pp. 288-293.

Sonia B. Martínez et al., "Use of Ozone in Wastewater Treatment to Produce Water Suitable for Irrigation", Water Resources Management, vol. 25, 2011, pp. 2109-2124.

H. Yanagida et al., "Simple removal technology using ozone solution for chemically-stable polymer used for MEMS", MEMS 2011, IEEE International Conference in Cancun, Mexico, Jan. 23-27, 2011, pp. 324-327.

Yousuke Goto et al., "Removal of Polymers with Various Chemical Structures using Wet Ozone", Journal of Photopolymer Science and Technology, vol. 23, No. 3, pp. 417-420 (2010).

Ryuji Hatsuki and Takatoki Yamamoto, "Development of Cr Etching with Ozone-water", The Japan Society of Mechanical Engineers, The third micro-nano-engineering symposium, Sep. 26 and 27, 2011, Tokyo, pp. 97-98.

* cited by examiner

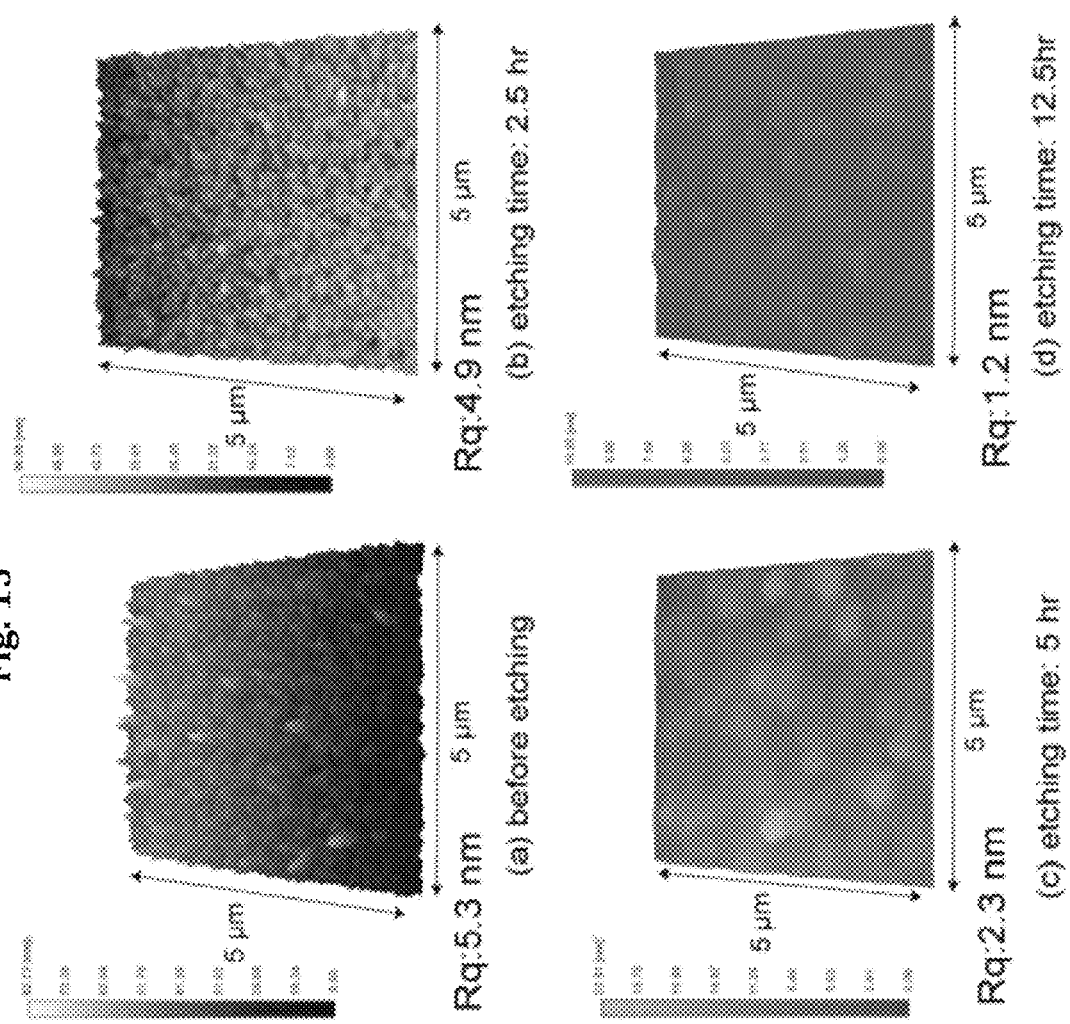

METHOD FOR ETCHING METAL OR METAL OXIDE BY OZONE WATER, METHOD FOR SMOOTHING SURFACE OF METAL OR METAL OXIDE BY OZONE WATER, AND PATTERNING METHOD USING OZONE WATER

CROSS REFERENCE TO RELATED APPLICATIONS

This patent application is a U.S. national stage application under 35 U.S.C. §371 of International Patent Application No. PCT/JP2013/062261 filed on Apr. 25, 2013, which claims the benefit of foreign priority to Japanese Patent Application No. JP 2012-103285 filed on Apr. 27, 2012, the disclosures of all of which are hereby incorporated by reference in their entireties. The International Application was published in Japanese on Oct. 31, 2013, as International Publication No. WO 2013/161959 A1 under PCT Article 21(2).

TECHNICAL FIELD

The present invention relates to a method for etching metal or metal oxide with ozone water, a method for smoothing a surface of metal or metal oxide with ozone water, and a patterning method that uses ozone water.

BACKGROUND ART

Etching is a technique used in patterning and other applications in a wide range of fields such as printing, semiconductor devices, and printed wire boards, and is indispensable as an underlying technique for microfabrication. Etching of metal can be broadly classified into dry etching that uses a plasma gas, and wet etching that uses chemical reaction in liquid.

Dry etching is suited for microfabrication but requires a large capital investment, and it is difficult to apply this technique to large area processes because of the limitations in process area. Further, dry etching of metal is an inherently difficult process, and this has led to the rise of the damascene process, which does not require dry etching metal, in the ultrafine wire fabrication of recent semiconductor devices.

On the other hand, wet etching is unsuited for miniaturization because it involves slower diffusion into a microstructure than in gases, and structural deformation and destruction that occur because of surface tension or other properties during a drying process. Another problem is the large environmental burden due to waste fluid. However, despite these problems, wet etching has been commonly used for its advantage of allowing etching over a large area, and represents a technique indispensable for the production of the wiring patterns and the printing plate of circuit boards in printed electronics.

A washing technique using more environmentally friendly ozone oxidation has attracted interest in a washing process that removes organic materials. Ozone self-decomposes into oxygen in the atmosphere, and has a small environmental burden. This, together with the strong oxidative power, has recently made ozone useful in applications such as removal of organic materials, and sterilization in sewage processes and medical sterilization using its sterilizing effect (see Non Patent Literature 1 and 2). In semiconductor industry, ozone has attracted interest as a material for green technology in washing display panels and removing photoresist (see Non Patent Literature 3 and 4).

Various techniques are known for the washing of display panels and the removal of photoresist using ozone water. Patent Literature 1 discloses performing an ozone water pretreatment and removing fine resist residues adhering to surfaces of a target etching material (metallic material, metal oxide) having resist patterns before etching. Patent Literature 2 discloses supplying high concentration ozone water to a substrate to remove organic materials, metal contaminants, and other such materials adhering to a substrate surface. It is also known to ionize and remove scraped copper with ozone water when smoothing a copper surface with a polishing pad on a logic circuit formed with copper wires (see Patent Literature 3).

However, in the invention described in Patent Literature 1, ozone water is used to remove resist material. Patent Literature 2 describes removing residues such as metal contaminants with ozone water. Patent Literature 3 describes ionizing and removing copper with ozone water. The removal of metal with ozone water as currently practiced in the art uses ozone water not by itself but in combination with hydrochloric acid or hydrofluoric acid (Patent Literature 4, Non Patent Literature 5). In actual practice, the inventions described in Patent Literature 2 and 3 also require addition of hydrochloric acid or hydrofluoric acid, and the environmental issues have not been completely solved.

With the recent advancement in nanotechnology, techniques of manipulating metal at an atomic level have been more important, such as in forming wires through etching of metal at an atomic level, and smoothing a metal surface at an atomic level. However, no method is available that can achieve these goals without using environmentally harmful reagents or materials.

CITATION LIST

Patent Literature

Patent Literature 1: JP-A-2002-38282
Patent Literature 2: JP-A-2000-164552
Patent Literature 3: JP-A-2000-173957
Patent Literature 4: JP-A-2005-270830
Non Patent Literature
Non Patent Literature 1: A. Azarpazhooh and H. Limeback: *The application of ozone in density: A systematic review of literature*, DENTISTRY, Vol. 36, No. 2, pp. 104-116 (2008)
Non Patent Literature 2: S. Martinez, J. Perez-Parra and R. Suay: *Use of ozone in Wastewater Treatment to Produce Water Suitable for Irrigation*, Water Resour Manage, Vol. 25, No. 9, pp. 2109-2124 (2011)
Non Patent Literature 3: H. Yanagida, S. Yoshida, M. Esashi and S. Tanaka: *Simple removal technology using ozone solution for chemically-stable polymer used for MEMS*, MEMS, pp. 324-327 (2011)
Non Patent Literature 4: Y. Goto, K. Kitano, T. Maruoka, M. Yamamoto, A. Kono, H. Horibe, S. Tagawa: *Removal of Polymers with Various Chemical Structures using Wet Ozone*, Journal of Photopolymer Science and Technology, Vol. 23, No. 3, pp. 417-42 (2010)
Non Patent Literature 5: Motonori Yanagi, and one other, *Washing Techniques using Environmentally Friendly Functional Water, 4th Topic, Case and Effect of Ozone Water Application* 1, (Online), (Search made Apr. 3, 2012), the Internet <URL: http://www.puriken.org/nms-04.htm>

SUMMARY OF INVENTION

Technical Problem

The present inventors conducted intensive studies, and found that ozone water of solely ozone dissolved in water can be used to etch metals or smooth surfaces of metals that are in wide use in microdevices and nanodevices, and that metal wires can be formed on a substrate without using an environmentally harmful etchant when ozone water etching is performed after a metal insoluble in ozone water is provided as a resist on a metal that dissolves in ozone water.

Specifically, an object of the present invention is to provide a method for etching metal or metal oxide with ozone water, a method for smoothing a surface of metal or metal oxide with ozone water, and a patterning method that uses ozone water.

Solution to Problem

The present invention is concerned with a method for etching metal or metal oxide with ozone water, a method for smoothing a surface of metal or metal oxide with ozone water, and a patterning method that uses ozone water, as follows.

(1) A method for etching metal or metal oxide with ozone water of solely ozone dissolved in water.

(2) The etching method according to (1), wherein the metal or the metal oxide is ionized either directly or via an intermediate in the ozone water at a pH of 4.3 to 4.4, and an oxidation-reduction potential of +2.07.

(3) The etching method according to (1) or (2), wherein the etching involves ultrasonic vibration and/or ultraviolet irradiation.

(4) A method for smoothing a surface of metal or metal oxide with ozone water of solely ozone dissolved in water.

(5) The smoothing method according to (4), wherein the metal or the metal oxide is ionized either directly or via an intermediate in the ozone water at a pH of 4.3 to 4.4, and an oxidation-reduction potential of +2.07.

(6) The smoothing method according to (4) or (5), wherein the smoothing involves ultrasonic vibration and/or ultraviolet irradiation.

(7) A patterning method that involves etching with ozone water of solely ozone dissolved in water, wherein the etching is performed after a metal insoluble in the ozone water is provided as a resist on a metal or metal oxide that is etchable with the ozone water.

(8) The patterning method according to (7), wherein the metal or the metal oxide is ionized either directly or via an intermediate in the ozone water at a pH of 4.3 to 4.4, and an oxidation-reduction potential of +2.07, and wherein the resist is a metal that is insoluble in ozone water at a pH of 4.3 to 4.4, and an oxidation-reduction potential of +2.07.

(9) The patterning method according to (7) or (8), wherein the etching involves ultrasonic vibration and/or ultraviolet irradiation.

Advantageous Effects of Invention

The present invention enables etching metal or metal oxide only with ozone water without using hydrochloric acid, hydrofluoric acid, or other such conventional etchant. The present invention is thus totally free from the environmentally problematic waste fluid issue involved in production of semiconductors and other products. Conventionally, different etchants are used for different metals, and this requires a plurality of etchant solutions, and a different waste fluid processing system for each etchant. In contrast, ozone water enables efficient etching because it allows etching of many different metals used in the field of semiconductors, and does not require changing etchants for different metallic species, and also does not require providing a waste fluid processing device.

Ozone water can be used not only for the etching of metal or metal oxide but for smoothing a surface at an atomic level. Ozone water is thus useful for the production of high precision nanodevices.

The metal removed by etching ionizes and dissolves in ozone water, and the dissolved metal can be collected simply by evaporating and drying the ozone water. This makes possible efficient use of resources such as the etched noble metal and rare metal.

Etching with ozone water also enables patterning metal at an atomic level without harming the environment when ozone water etching is performed after a metal (such as Ti) insoluble in ozone water is vapor deposited as a resist on a metal that is etchable with ozone water.

BRIEF DESCRIPTION OF DRAWINGS

FIG. 15 shows AMF images of a Cr sample after a predetermined time period of etching with ozone water.

DESCRIPTION OF EMBODIMENTS

Figure 1:
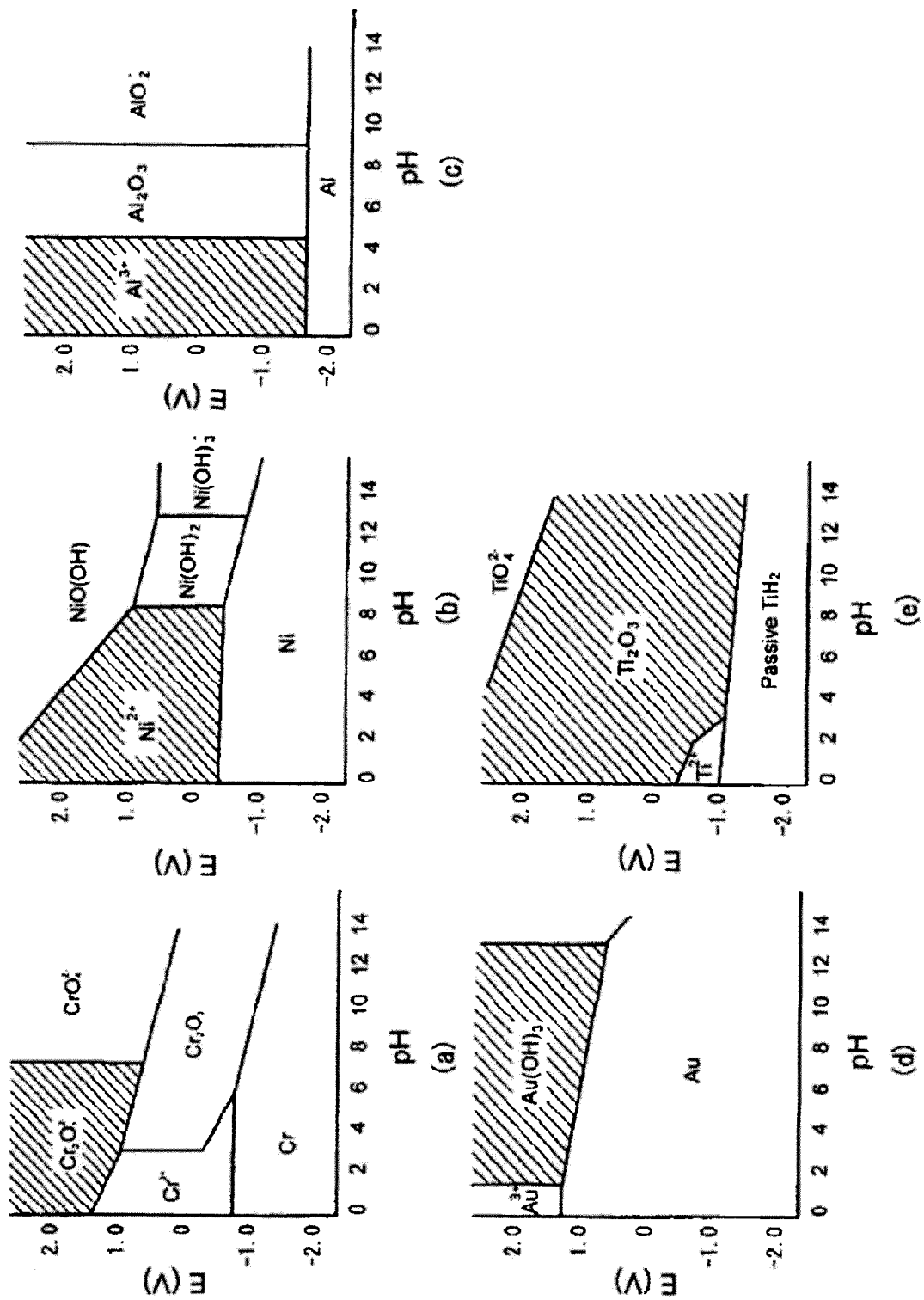
FIG. 1 represents the relationships between pH and oxidation-reduction potential for different metals.

The following describes the present invention in detail, specifically a method for etching metal or metal oxide with ozone water, a method for smoothing a surface of metal or metal oxide with ozone water, and a patterning method that uses ozone water.

The ozone water of the present invention is of solely ozone dissolved in water. Conventional metal etchants use materials such as hydrochloric acid, nitric acid, sulfuric acid, hydrofluoric acid, perchloric acid, phosphoric acid, ammonium cerium(IV) nitrate, iodine, potassium iodide, tetramethylammonium hydroxide (TMAH), potassium hydroxide (KOH), hydrogen peroxide water, and acetic acid. These are environmentally harmful, and the waste fluid cannot be disposed of unless treated beforehand. This adds to the cost. Ozone water has been used for washing in the field of semiconductors as described in the foregoing Patent Literature and Non Patent Literature. However, hydrochloric acid or the like is added to dissolve the metal residues, and ozone water only has a supportive role. Further, ozone water is conventionally intended to remove impurities such as resist compounds and metal residues, and is not used for etching a bulk metal itself. Unlike the conventional use of ozone water, the ozone water of the present invention is solely used for etching a bulk metal or metal oxide itself, and for smoothing a bulk metal surface or a metal oxide surface (hereinafter, etching and smoothing are also referred to simply as "etching", and metal and metal oxide are also referred to simply as "metal").

The ozone water of the present invention is produced with ozone generated from oxygen and dissolved in water. The water used may be any of tap water, distilled water, and ultrapure water, and is preferably ultrapure water because it does not contain impurities, and provides a stable quality. The concentration of ozone water depends on the type of the dissolved metal and temperature, and is preferably about 2 ppm or more. A concentration below 2 ppm makes the metal etching rate too slow, and is not practical. With an ozone water concentration of about 2 ppm or more, the etching rate improves in proportion to ozone water concentration.

The etching temperature of ozone water is preferably 20 to 60° C., particularly preferably 40 to 60° C. An etching temperature of 20° C. or less makes the metal etching rate too slow, and is not practical. An etching temperature above 60° C. increases the etching rate, but is not preferred because the ozone decomposition accelerates. The etching rate is highly dependent on ozone concentration and temperature, and may be appropriately adjusted according to the type of etched metal, and the etch depth. In actual practice, the supplied ozone amount may be adjusted to provide the desired ozone concentration with the use of an ozone concentration monitoring device. A heater or the like may be used to provide a constant temperature for ozone water.

Etching may be performed by dipping metal in ozone water, or by spraying or showering ozone water over metal. For improved etching effect, ultrasonic vibration may be applied during the etching. It is also possible to use ultraviolet irradiation from a low-pressure mercury lamp in combination. For example, water may be irradiated with vacuum ultraviolet rays of 172 nm wavelength, or titanium oxide may be irradiated with ultraviolet rays in water to reconvert oxygen into ozone in water, and increase the ozone concentration.

The metal etching time may be appropriately adjusted according to the type of etched metal, etch depth, ozone water concentration, and temperature.

The metal etched or the metal smoothed on the surface by the present invention is not particularly limited, as long as it is etched in the end with ozone water alone. Examples include metals that are directly ionized with ozone water, and metals that are ionized via intermediates such as hydroxide and oxide. The present inventors found that dissolving 10 mg/L or more of ozone in water stabilizes the oxidation-reduction potential at about +2.07, and stabilizes the pH at about 4.3 to 4.4, irrespective of the ozone concentration, though the pH slightly varies with temperature. The product of the reaction between metal and the solution can be predicted to a certain extent from pH and oxidation-reduction potential such as in the pH vs. oxidation-reduction potential diagrams for different metals shown in FIG. 1. The upper limit of ozone water concentration is not particularly limited, as long as ozone is dissolved in water, and may be appropriately adjusted according to such factors as the type of etched metal, and etch depth.

For example, the reaction that oxidizes Cr with ozone and produces $Cr_2O_7^{2-}$ appears to become dominant at a pH near 4.3 to 4.4, and an oxidation-reduction potential near +2.07 V. It also appears that $Cr_2O_7^{2-}$ exists in a mixed state with $Cr^{3+}$ during the etching because $Cr_2O_7^{2-}$ turns itself into $Cr^{3+}$ in an acidic solution. Similarly, the reaction that ionizes Ni to $Ni^{2+}$, and the reaction that ionizes Al to $Al^{3+}$ appear to dominate. Au is believed to become $Au(OH)_3$, and a reaction that produces $Au^{3+}$ and $3OH$ from $Au(OH)_3$ appears to take place in the aqueous solution, though to limited extent. As clearly indicated by the Arrhenius plot to be described later, Au shows an activation energy about twice as small as those of other metals, and ionizes via hydroxide unlike other metals that ionize through oxidation. The distinctly different activation energy of Au is believed to be due to the different etching mechanism, and etching appears to proceed, though the rate is slow. In contrast, Ti forms the passive $Ti_2O_3$, and etching does not appear to proceed, as clearly indicated in FIG. 1 and Comparative Examples (described later).

Metals that directly ionize with ozone water, and metals that ionize via intermediates such as hydroxide and oxide in etching are not limited to Cr, Ni, Al, and Au. Non-limiting examples of other such metals include Cu, Ag, Fe, Pt, Mn, Zn, Pd, and Ir.

The present invention enables etching metal by dissolving metal with ozone water in the manner described above. The present invention also enables smoothing a metal surface at an atomic level, in a manner different from the conventional approach using a conventional etchant. As used herein, "smoothing" does not mean dissolving and removing organic materials, metal residues, and other such materials on a substrate with an etchant, or smoothing a surface by polishing metal with a polisher, but means dissolving a bulk metal surface with ozone water, and smoothing the metal surface at an atomic level.

The ozone water smoothing distinguishes itself over the use of conventional etchants by the very small molecule size of ozone ions as small as water molecules, and the high diffusion coefficient of ozone, providing easier entry between the metal atoms. The metal atoms projecting out of the surface have large defects, and are highly reactive. This, combined with the large surface area/volume ratio, allows these metal atoms to be quickly ground down. It is believed that ozone does not tend to depend on crystal orientation, and this appears to be a reason that enables smoothing without creating a crystal plane in the etched metal surface. Some conventional etchants dissolve metal, and form compounds with the metal. Such compounds may accumulate and form irregularities on metal surface. Ozone, on the other hand, does not form such compounds and thus does not form surface irregularities.

For improved accuracy, atomic level surface smoothing is required in the field of semiconductors and other applications. The etching or smoothing rate of metal with ozone water is slower than the rates of conventional etchants, though it depends on the concentration and temperature of ozone water. However, the ozone water smoothing is effective for high accuracy smoothing and atomic level smoothing in terms of conditions such as etch depth, the extent of smoothing, and process time. For faster smoothing, the smoothing method of the present invention may be used in the final smoothing process after smoothing the surface to some extent by using conventional techniques such as polishing.

With the advancement in nanotechnology, the trend for further miniaturization and higher density is expected to continue in semiconductors, and the need for finer, atomic-level circuits should arise. The atomic level etching or smoothing with the ozone water of the present invention is very useful for the production of nanodevices because the process proceeds at a rate sufficient for actual applications, and enables etching to be very finely controlled under the adjusted temperature and concentration of the ozone water.

It has been required to use different etchant compositions for different metals requiring etching or smoothing, and to use a different waste fluid process suited for each etchant. However, ozone water can dissolve many different metals commonly used in the field of semiconductors, and there is no need to change etchants according to the metallic species. Further, the need for a waste fluid processing device is eliminated, and efficient etching or smoothing is possible.

Metal etching with conventional etchants involves formation of a compound by a reaction of etchant and metal, and the process may require isolating the metal when reusing the metal. On the other hand, ozone water turns itself into water over time, and metal can be collected simply by drying. This makes it possible to easily collect noble metals and rare metals such as gold, and reuse such resources.

Further, because ozone water decomposes into oxygen and water over time, the rinsing following the etching or smoothing process can be sufficiently carried out only with water. This simplifies the manufacturing steps of semiconductors and other products, and solves the waste issue.

The present invention can etch metal or smooth metal surface with ozone water alone. The invention also allows insolubilizing or ionizing metal by adjusting the pH of ozone water. Specifically, for example, a pH adjuster may be added to ozone water to ionize metal that cannot be ionized with the pH and the oxidation-reduction potential of the ozone water alone, or to directly ionize metal, for example, such as Au, that ionizes in two steps, provided that it does not harm the environment which is the object of the present invention. Examples of environmentally unharmful pH adjusters include sodium bicarbonate, carbon dioxide gas, and ammonium carbonate. By making the pH more alkaline, the etching rate can be increased ten fold or more, though the ozone lifetime becomes shorter.

While some metals are etched with ozone water, other metals, such as Ti, form a passive oxidation coating with ozone water, as described above. Such metals do not ionize and dissolve in ozone water once a passive oxidation coating is formed. By using this property, for example, ozone water etching may be performed after a metal, such as Ti, that is not etchable with ozone water is provided as a resist on a metal that is etchable with ozone water. This enables patterning at an atomic level without harming the environment.

The present invention is described below in greater detail using Examples. It should be noted that the following Examples are given solely for the purpose of illustrating the present invention as a reference to the specific aspects of the invention. The following illustrative examples describing the specific aspects of the present invention are not intended to limit or restrict the scope of the invention disclosed herein.

EXAMPLES

Experimental Apparatus

Figure 2:
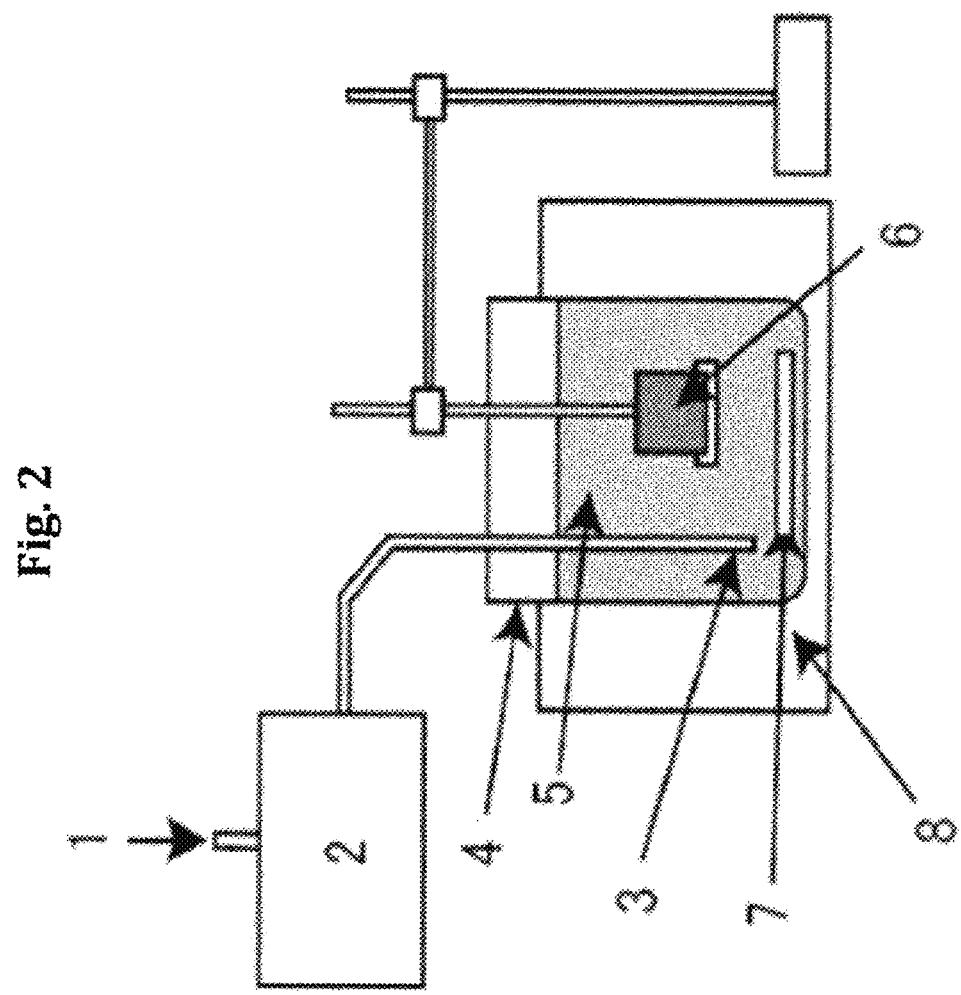
FIG. 2 is a diagram schematically representing an experimental apparatus used in the present invention.

FIG. 2 is a diagram schematically representing an experimental apparatus used in the present invention. Ozone was produced with an ozone generator 2 (ED-OG-R4, Ecodesign) by using oxygen gas 1 as raw material. The ozone was supplied into the ultrapure water in a beaker 4 through a gas bubbler 3 to produce ozone water 5. An etching experiment was conducted by dipping a sample substrate 6 in the ozone water 5 for a predetermined time period. In order to provide a uniform ozone concentration in the ozone water, the dissolved ozone concentration was monitored with a photoabsorptive dissolved ozone concentration meter (O3-3F, Kasahara Chemical Instruments, not shown) while stirring the ozone water with a stirrer 7 throughout the etching process. For the evaluation of the temperature dependence of etching, the liquid temperature was maintained constant with an external heater 8.

Fabrication of Sample Substrate 6

The sample substrate 6 for etching evaluation was fabricated by forming various metal films on an optically polished glass substrate (surface roughness of 1 nm or less) by vacuum vapor deposition, and patterning the surface by photolithography to provide an alternately occurring metal and glass surfaces.

Etching Rate Evaluation

Etching rate was evaluated by measuring the height from the glass surface to the metal surface before and after the etching. An optical interference profilometer (WYKO NT 9100A, Bruker AXS) was used for the measurement. The average of 5 measurement points taken on the substrate under each condition was used as the measured value.

Post-Etching Surface Roughness Evaluation

Surface roughness was compared and evaluated for metals subjected to ozone water etching, and metals etched with a common etchant. Surface roughness was evaluated after etching about 30 nm into metals by conventional etching and ozone water etching. The surface roughness of the etched metal was evaluated in terms of the root-mean-square roughness (Rq: JIS 1994) taken at 15 arbitrary regions (5 μm×5 μm) on the substrate, using an atomic force microscope (AMF; VN-8010, KEYENCE).

Metal Etching Rate

Example 1

Figure 3:
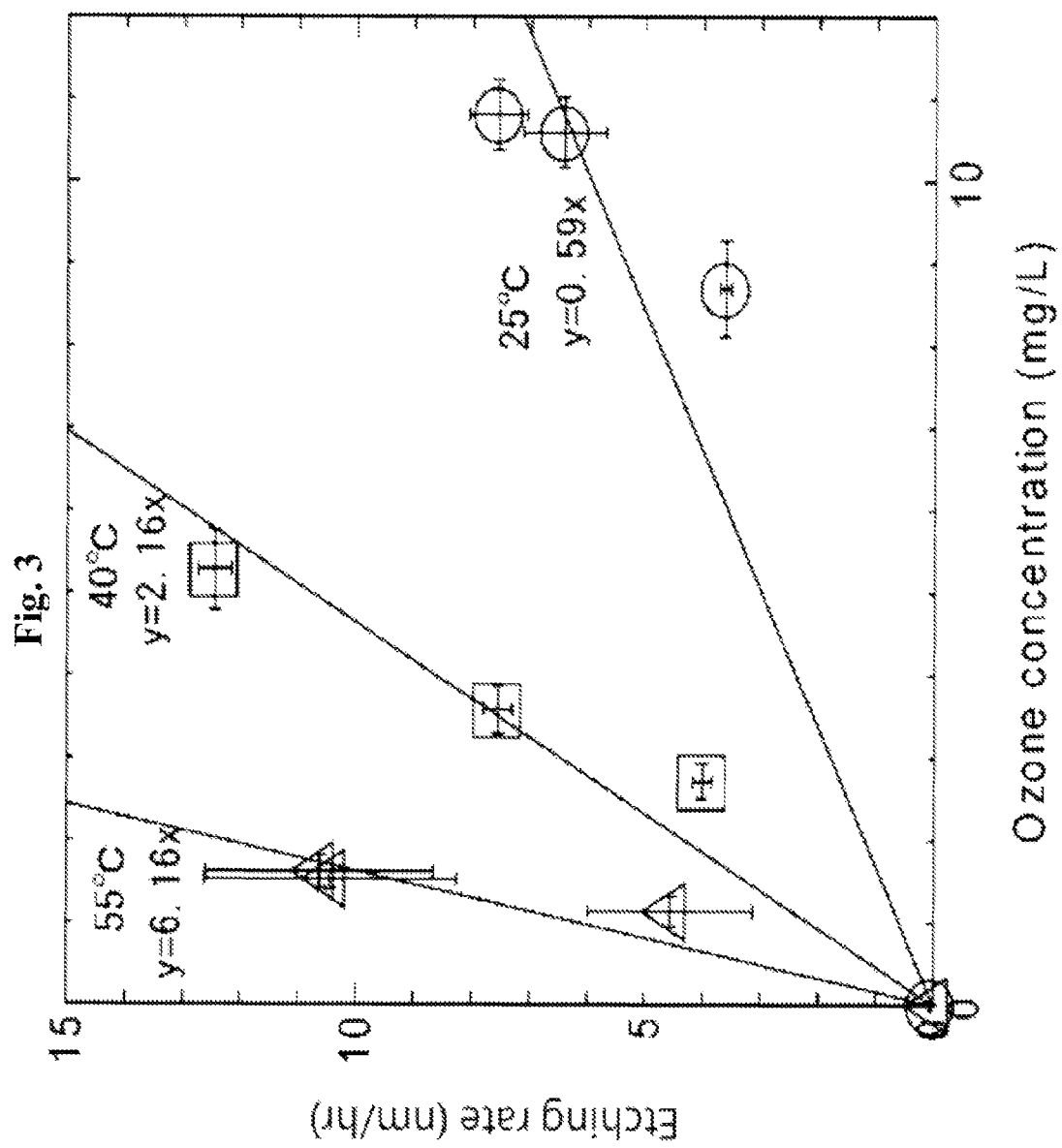
FIG. 3 is a graph representing the measurement results for the etching rate of Cr, showing the relationship between ozone water temperature and concentration versus the etching rate of Cr.

A sample substrate with vapor deposited Cr was produced by using the procedures described in Fabrication of Sample Substrate 6 above. Etching was performed under varying dissolved ozone concentrations and temperatures (25° C., 40° C., and 55° C.). After the etching, the sample substrate 6 was thoroughly rinsed with ultrapure water, and dried for evaluation. The etching rate was measured by using the procedures described in Etching Rate Evaluation above. FIG. 3 is a graph representing the measurement results. In the graph, the vertical axis and the horizontal axis represent etching rate and ozone concentration, respectively, and the error bars each represent standard deviation. Solid lines are the approximation straight lines obtained by using the method of least squares. The same notation is used in FIGS. 4 to 7.

Example 2

Figure 4:
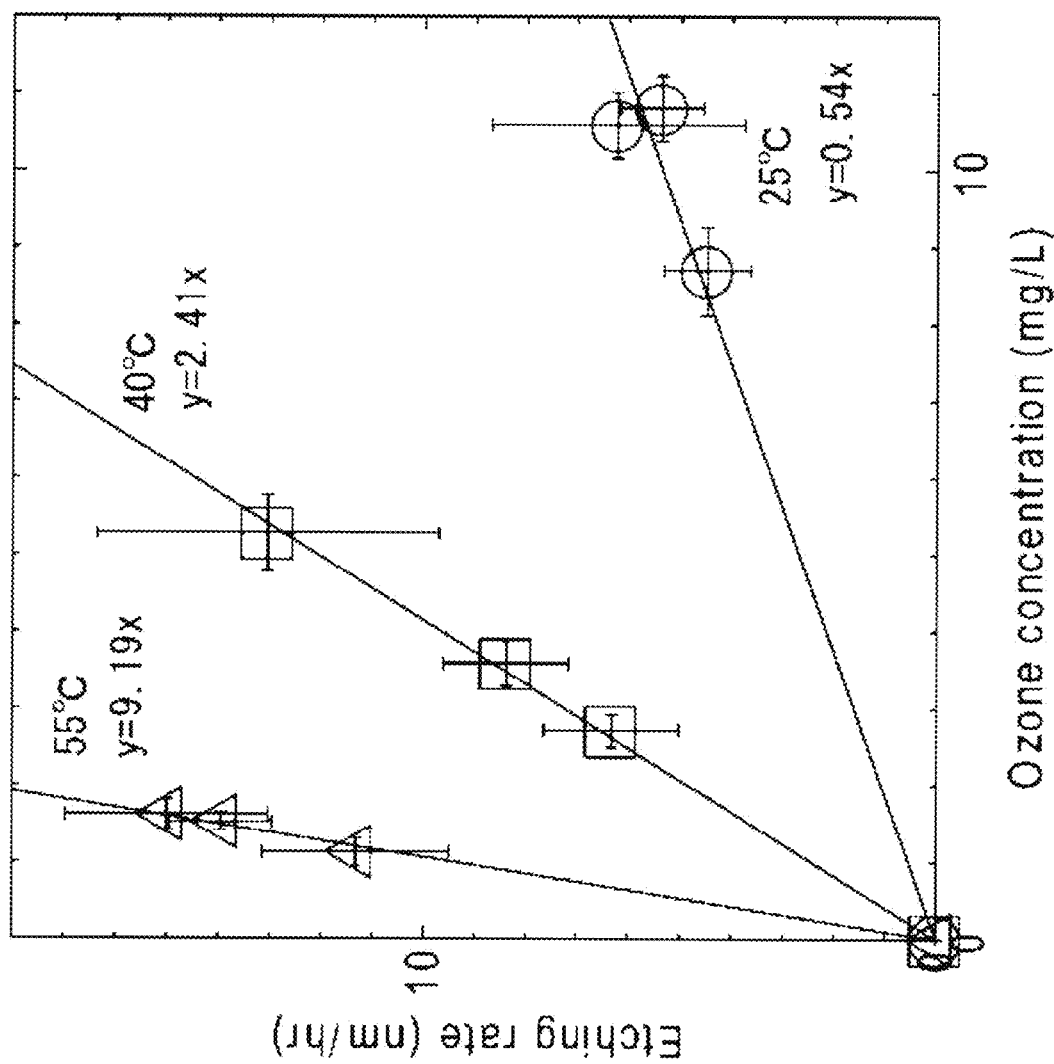
FIG. 4 is a graph representing the measurement results for the etching rate of Ni, showing the relationship between ozone water temperature and concentration versus the etching rate of Ni.

Etching rate was measured by using the same procedures used in Example 1, except that Ni was used. FIG. 4 is a graph representing the measurement results.

Example 3

Figure 5:
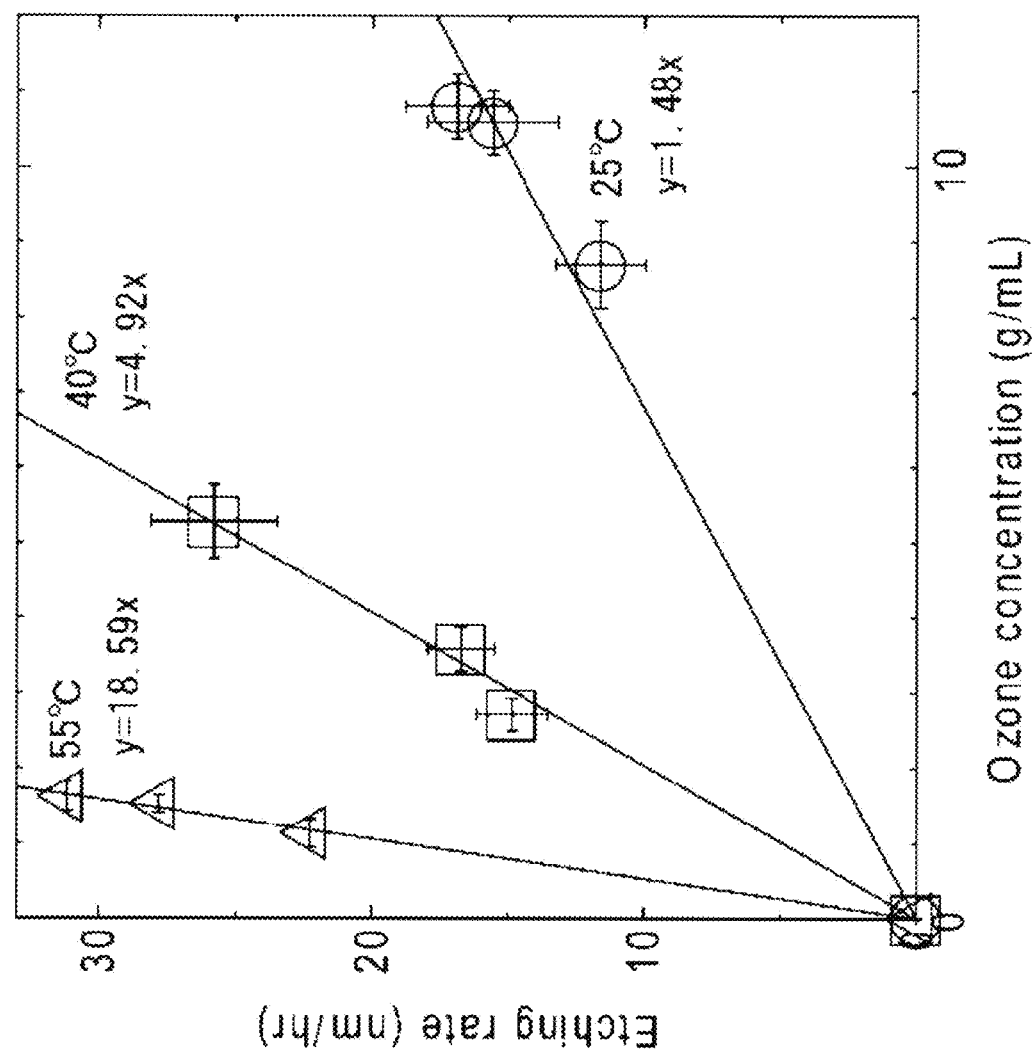
FIG. 5 is a graph representing the measurement results for the etching rate of Al, showing the relationship between ozone water temperature and concentration versus the etching rate of Al.

Etching rate was measured by using the same procedures used in Example 1, except that Al was used. FIG. 5 is a graph representing the measurement results.

Example 4

Figure 6:
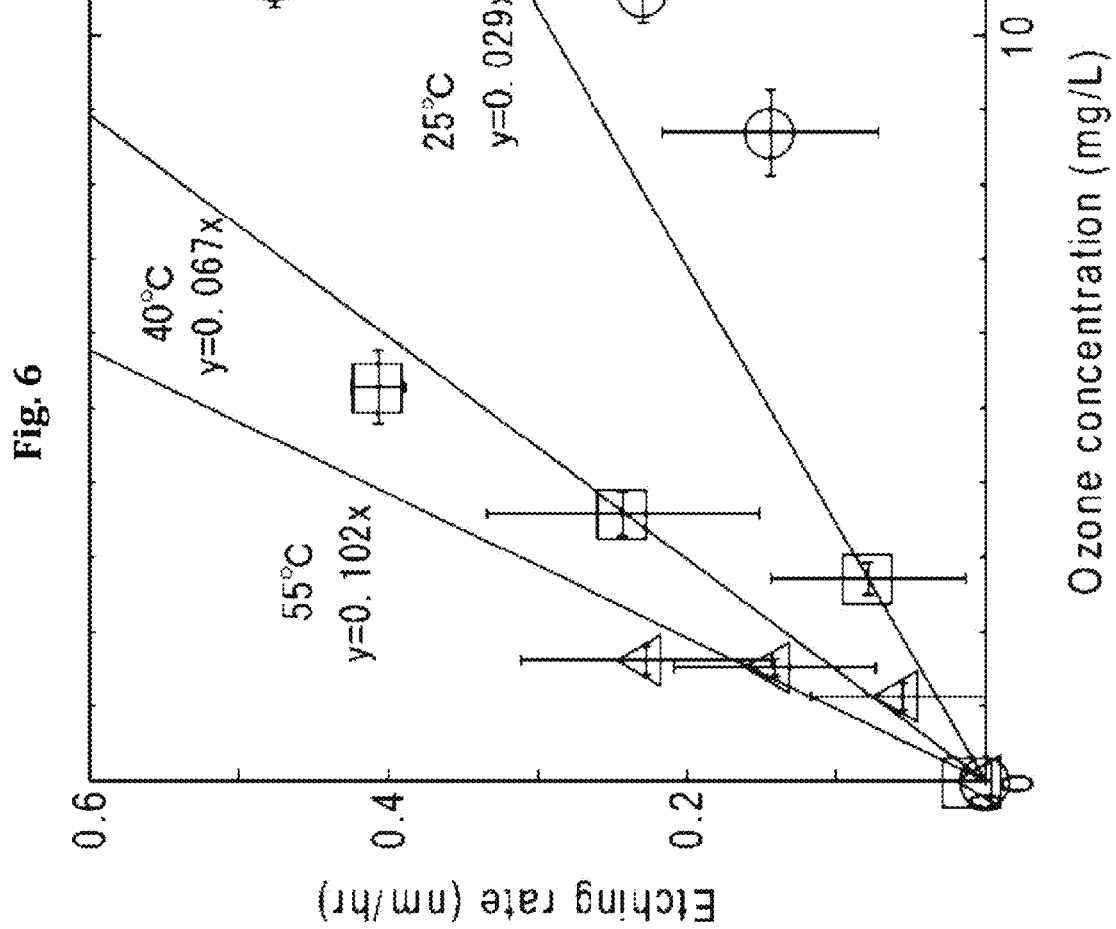
FIG. 6 is a graph representing the measurement results for the etching rate of Au, showing the relationship between ozone water temperature and concentration versus the etching rate of Au.

Etching rate was measured by using the same procedures used in Example 1, except that Au was used. FIG. 6 is a graph representing the measurement results.

Comparative Example 1

Figure 7:
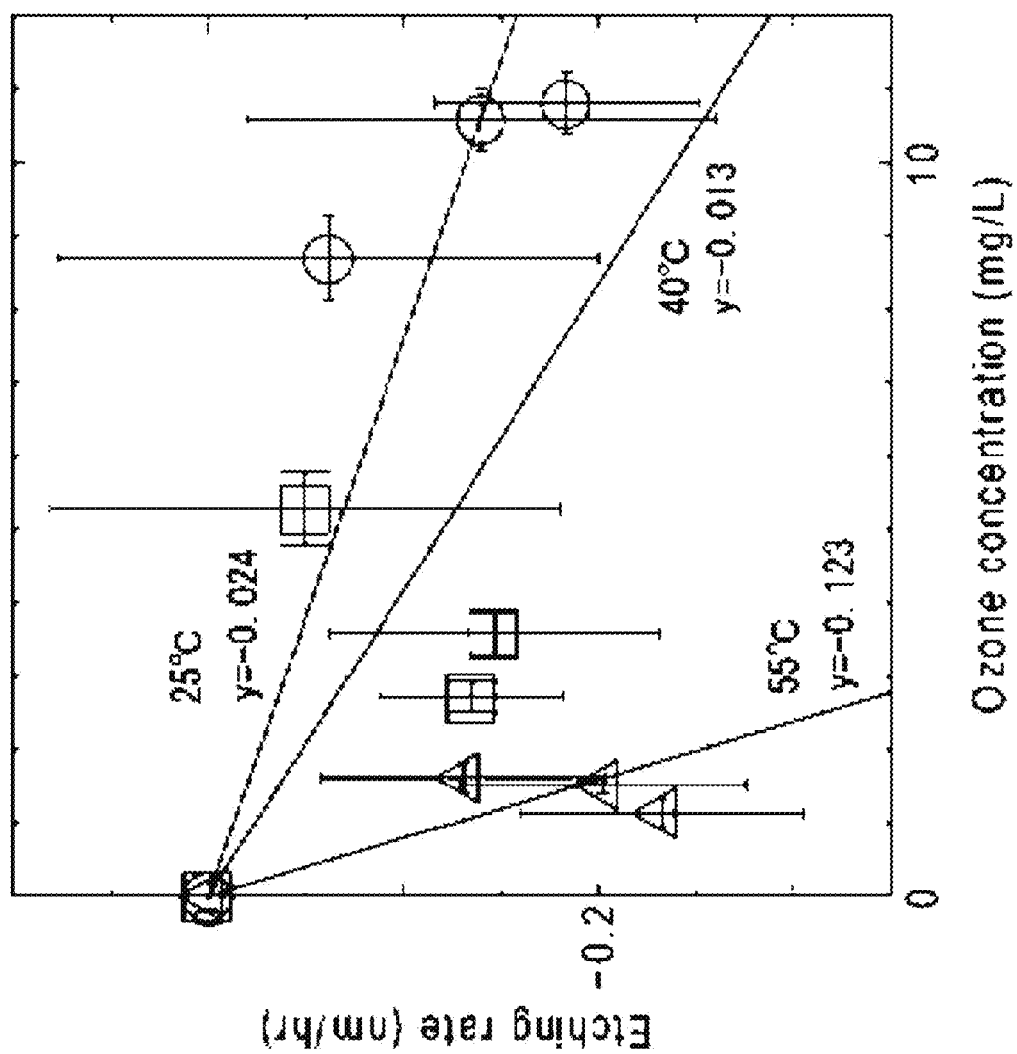
FIG. 7 is a graph representing the measurement results for the etching rate of Ti, showing the relationship between ozone water temperature and concentration versus the etching rate of Ti.

Etching rate was measured by using the same procedures used in Example 1, except that Ti was used. FIG. 7 is a graph representing the measurement results.

As clearly shown in the results of Examples 1 to 4 and Comparative Example 1, the etching rates of Cr, Ni, Al, and Au increased with increase in the ozone concentration of the ozone water. It was also found that the etching rate increased with increasing ozone water temperatures. However, because the ozone lifetime becomes shorter as the ozone water temperature increases, the dissolved ozone concentration itself decreased. That is, the balance between ozone concentration and temperature was found to be important in the etching of metal with ozone water, and the effect of temperature was found to be more dominant than the dissolved ozone concentration.

Ti was not etched with ozone water, and formed an oxidation coating instead. It was found that the oxidation coating formed at increasing rates with increasing ozone concentrations in ozone water, and with increasing ozone water temperatures.

Figure 8:
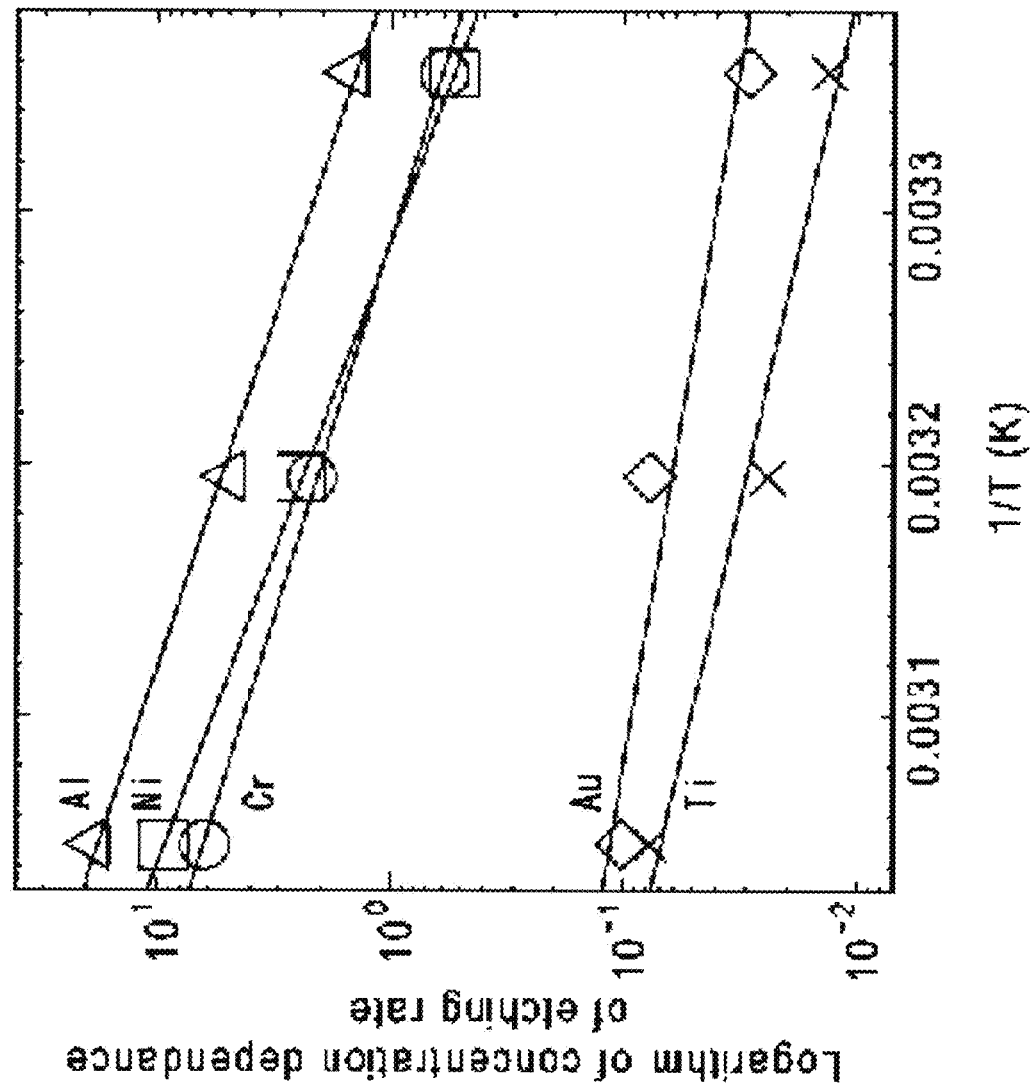
FIG. 8 represents an Arrhenius plot with an inverse of temperature taken on the horizontal axis against the vertical axis representing a logarithm of the slope of the least square approximation straight lines obtained in FIGS. 3 to 7.

FIG. 8 represents an Arrhenius plot with an inverse of temperature taken on the horizontal axis against the vertical axis representing a logarithm of the slope of the least square approximation straight lines obtained in FIGS. 3 to 7. The linearity of the Arrhenius plot confirmed that the etching reaction followed the Arrhenius equation. The activation energy (the slope of the plot) was essentially the same for Al, Cr, and Ni, and the result that Au showed an activation energy that was at least two times smaller than the activation energies of these metals suggests that Al, Cr, and Ni have similar etching mechanisms, different from the etching mechanism of Au. Note that the activation energy of Ti shown in FIG. 8 was determined from the increased thickness, and is not based on etching.

Post-Etching Surface Roughness of Metal

Example 5

Figure 9:
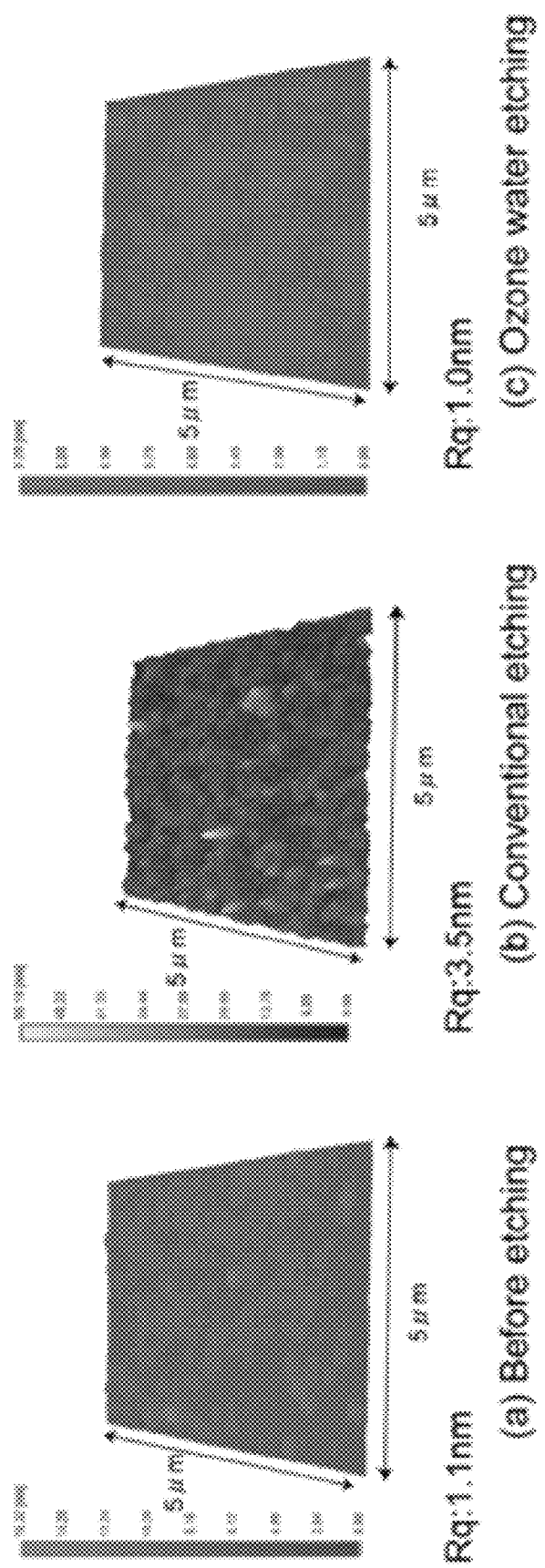
FIG. 9 shows AMF images of a Cr sample (a) before etching, (b) after etching with a conventional etchant, and (c) after etching with ozone water.
Figure 10:
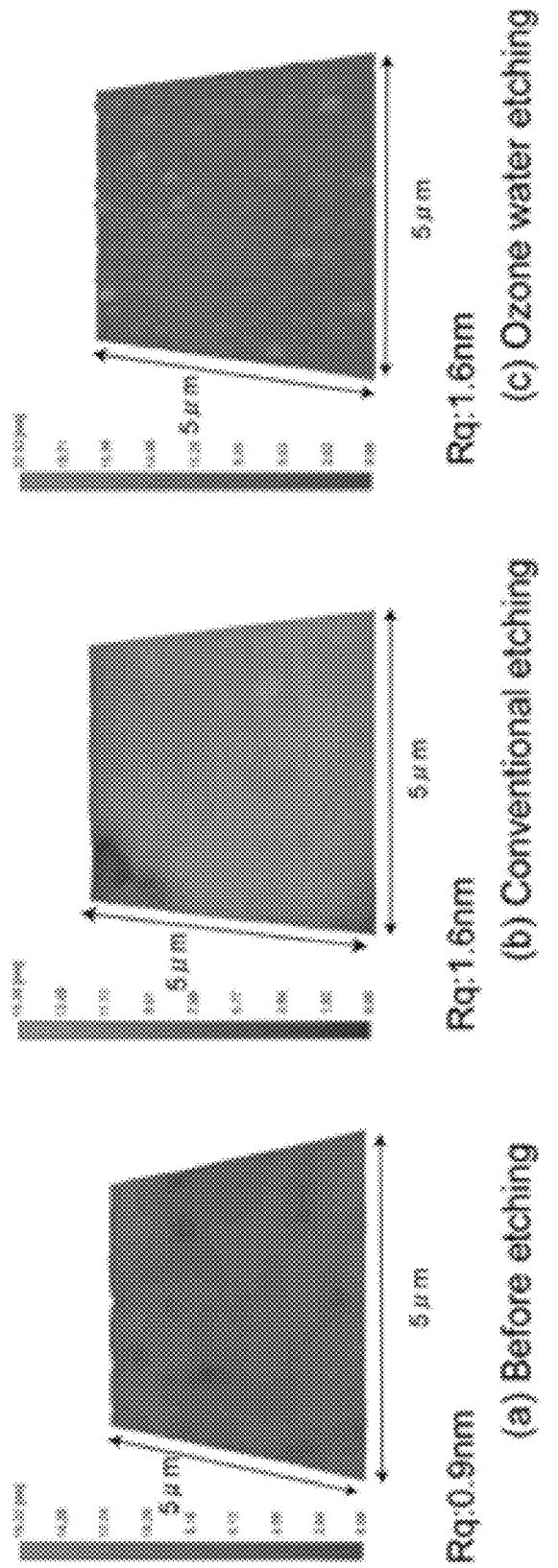
FIG. 10 shows AMF images of a Ni sample (a) before etching, (b) after etching with a conventional etchant, and (c) after etching with ozone water.

A Cr sample produced by using the procedures described in Fabrication of Sample Substrate 6 above was dipped in ozone water (temperature 25° C., ozone concentration 10.81 mg/L) for about 4 hours, and etched about 30 nm. After the etching, the sample substrate 6 was thoroughly rinsed with ultrapure water, and dried for evaluation. The surface roughness was measured by using the procedures described in Post-Etching Surface Roughness Evaluation above. FIG. 9(a) represents an AMF image at an arbitrary location of the sample before etching, and FIG. 9(c) represents an AMF image at the arbitrary location of the sample after the etching of Example 5. In FIGS. 9 to 13 and FIG. 15, Rq (nm) on the bottom left of each image represents the root-mean-square roughness at an arbitrary location of the sample.

Comparative Example 2

Surface roughness was measured by using the same procedures used in Example 5, except that a mixed acid of ammonium cerium(IV) nitrate+perchloric acid+water=165 g+43 mL+water (total liquid volume=1 L) was used as the etchant, and that the dip time was changed to 30 seconds. The chemicals used in Comparative Examples 2 to 6 are all products from Kanto Kagaku. FIG. 9(b) represents an AMF image at an arbitrary location of the sample after the etching of Comparative Example 2.

Example 6

Surface roughness was measured by using the same procedures used in Example 5, except that a Ni sample was used, and that the dip time was changed to about 6 hours. FIG. 10(a) represents an AMF image at an arbitrary location of the sample before etching, and FIG. 10(c) represents an AMF image at the arbitrary location of the sample after the etching of Example 6.

Comparative Example 3

Surface roughness was measured by using the same procedures used in Example 6, except that a mixed acid of hydrochloric acid 85%+15% nitric acid was used as the etchant, and that the dip time was changed to 15 seconds. FIG. 10(b) represents an AMF image at an arbitrary location of the sample after the etching of Comparative Example 3.

Example 7

Surface roughness was measured by using the same procedures used in Example 5, except that an Al sample was used, and that the dip time was changed to about 2.5 hours. FIG. 11(a) represents an AMF image at an arbitrary location of the sample before etching, and FIG. 11(c) represents an AMF image at the arbitrary location of the sample after the etching of Example 7.

Comparative Example 4

Figure 11:
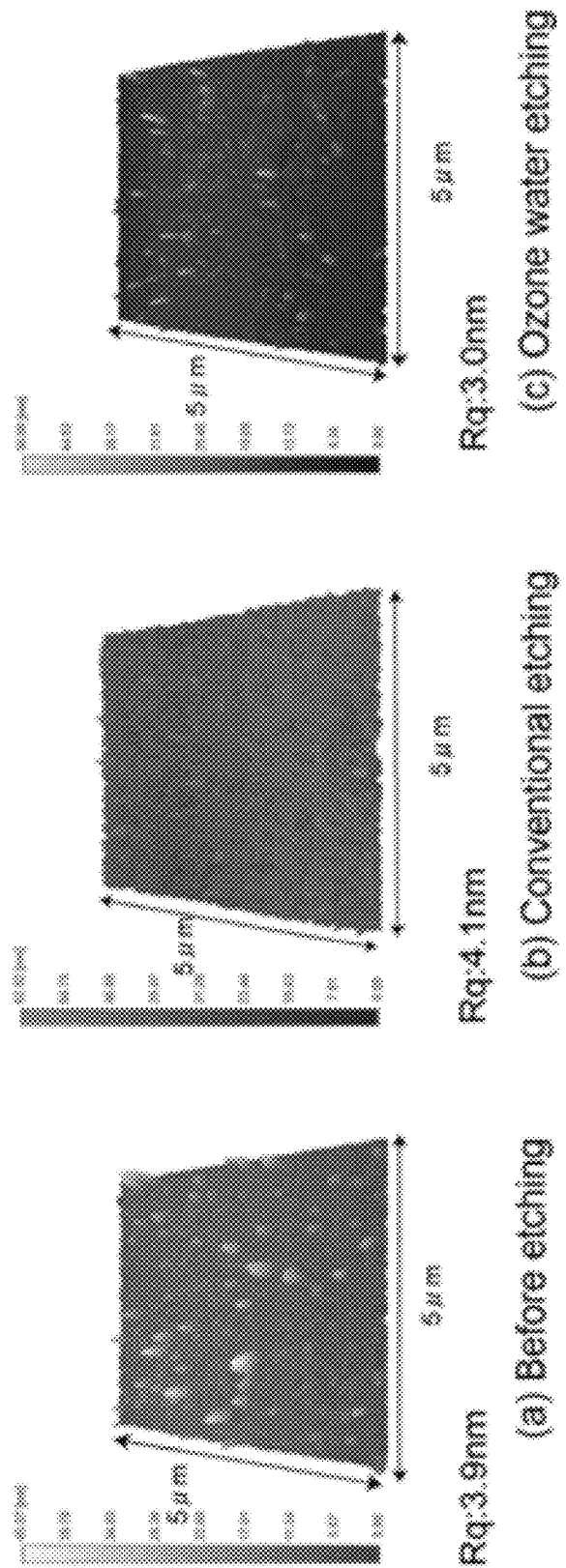
FIG. 11 shows AMF images of an Al sample (a) before etching, (b) after etching with a conventional etchant, and (c) after etching with ozone water.

Surface roughness was measured by using the same procedures used in Example 7, except that a mixed acid of phosphoric acid 80%+nitric acid 5%+acetic acid 10%+water 5% was used as the etchant, and that the dip time was changed to 10 seconds. FIG. 11(*b*) represents an AMF image at an arbitrary location of the sample after the etching of Comparative Example 4.

Example 8

Figure 12:
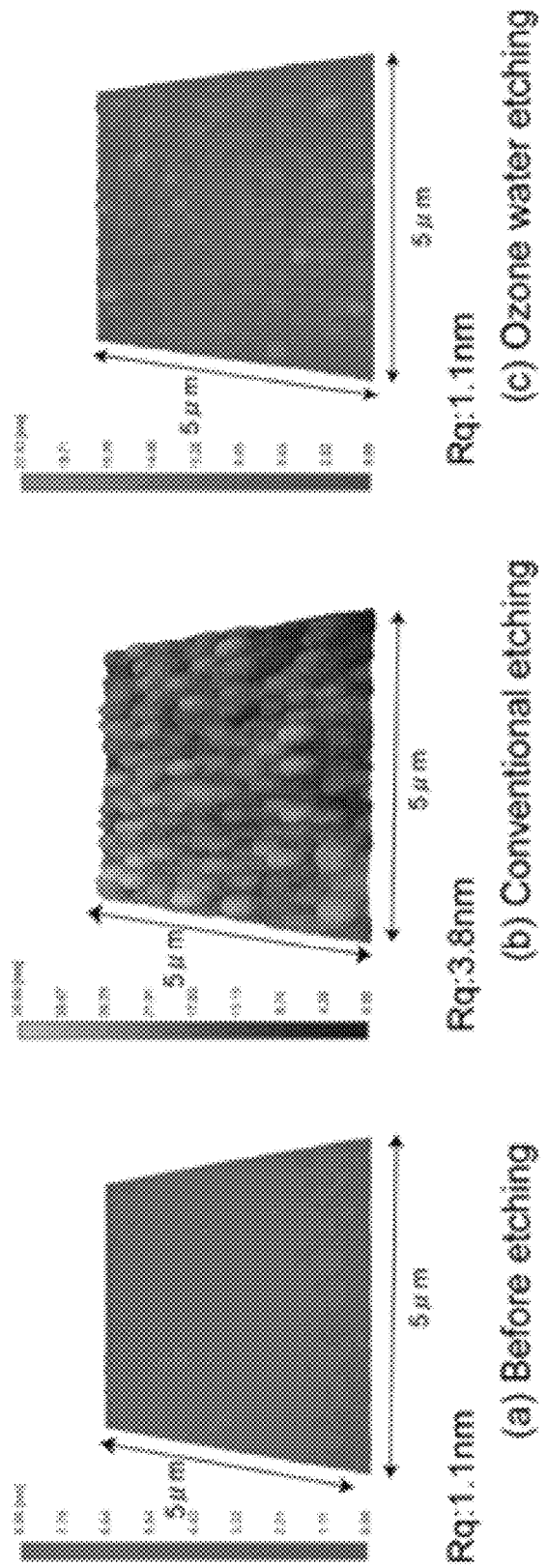
FIG. 12 shows AMF images of an Au sample (a) before etching, (b) after etching with a conventional etchant, and (c) after etching with ozone water.

Surface roughness was measured by using the same procedures used in Example 5, except that an Au sample was used, and that the dip time was changed to about 60 hours. FIG. 12(*a*) represents an AMF image at an arbitrary location of the sample before etching, and FIG. 12(*c*) represents an AMF image at the arbitrary location of the sample after the etching of Example 8.

Comparative Example 5

Surface roughness was measured by using the same procedures used in Example 8, except that an aqueous solution of iodine 5%+potassium iodide 10% was used as the etchant, and that the dip time was changed to 15 seconds. FIG. 12(*b*) represents an AMF image at an arbitrary location of the sample after the etching of Comparative Example 5.

Comparative Example 6

Figure 13:
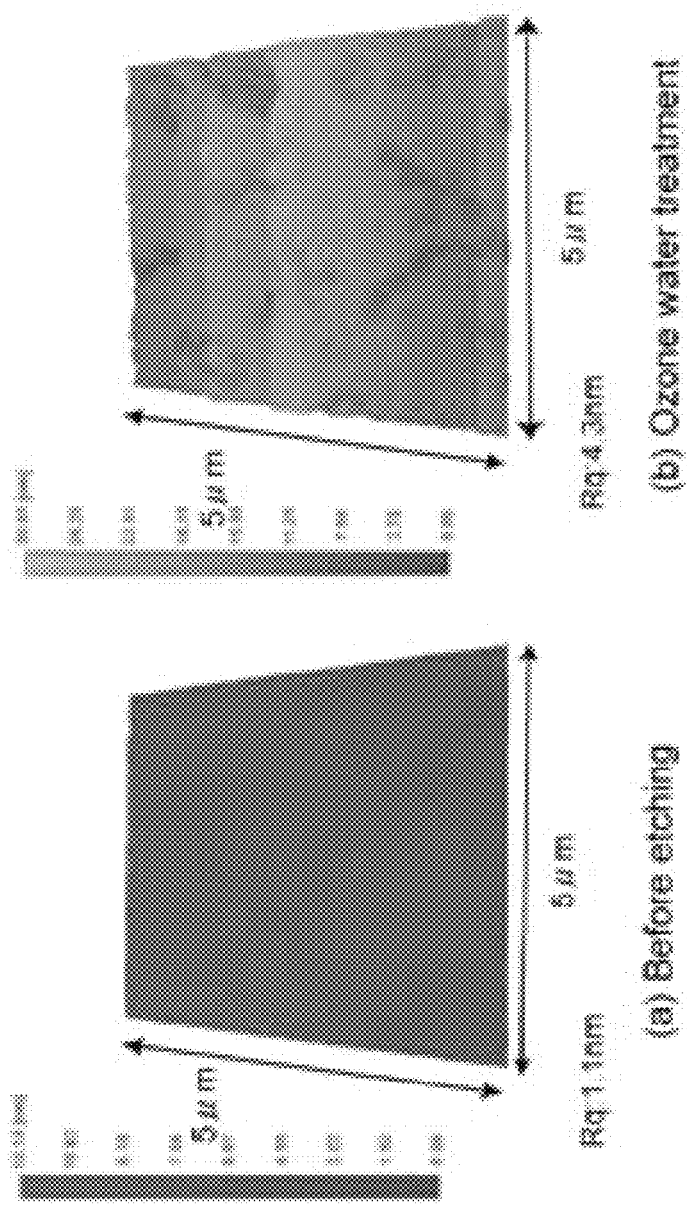
FIG. 13 shows AMF images of a Ti sample (a) before etching, and (b) after etching with ozone water.

Because ozone water does not etch the Ti sample as noted above, surface roughness was measured in the same manner as in Example 5 except that the dip time was changed to about 24 hours, and the result was not compared with the conventional etchant. FIG. 13(*a*) represents an AMF image at an arbitrary location of the sample before etching, and FIG. 13(*b*) represents an AMF image at the arbitrary location of the sample after the etching of Comparative Example 6.

Table 1 below summarizes the Rq values (nm) determined from the AFM images taken at 15 arbitrary locations in Examples 5 to 8, and Comparative Examples 2 to 6.

TABLE 1

| Metal | Before etching | After conventional etching | After ozone water etching |
|---|---|---|---|
| Cr | 1.32 ± 0.39 | 3.61 ± 1.12 | 1.17 ± 0.22 |
| Ni | 0.87 ± 0.37 | 1.71 ± 0.34 | 1.69 ± 0.79 |
| Al | 4.10 ± 0.49 | 4.29 ± 1.07 | 3.17 ± 0.72 |
| Au | 1.11 ± 0.28 | 3.86 ± 0.44 | 1.06 ± 0.28 |
| Ti | 1.19 ± 0.32 | — | 4.37 ± 2.43 |

As is clear from Table 1, the ozone water etching of Cr, Ni, Al, and Au produced flatter surfaces than conventional etching. The surfaces were particularly smooth at an atomic level in, for example, Cr and Au with Rq=1 nm, demonstrating that the technique was desirable not only for etching but for producing an atomically smooth surface. The absence of any local crystal plane suggests that the ozone water etching is isotropic, and is not dependent on crystal orientation.

The ozone water etching of Ni produced a smoother surface than conventional etching. However, the etched surface was rough compared to the roughness measured before etching. This is considered to be due to the partial formation of hydroxide, which appears to occur as the Ni in contact with ozone water at an ozone water pH of 4.3 and an oxidation-reduction potential near +2.07 V is in the vicinity of the boundary where $Ni^{2+}$ and $NiO(OH)$ are formed. However, because the ozone water pH is adjustable with addition of a pH adjuster to ozone water to the extent that it is not harmful to the environment, a pH lowering agent may be added to ozone water when dissolving Ni so that Ni directly becomes $Ni^{2+}$.

The Ti sample dipped in ozone water had a rough surface because of the growth of what appeared to be a porous $Ti_2O_3$ coating.

Time Dependence of Surface Roughness

Example 9

Figure 14:
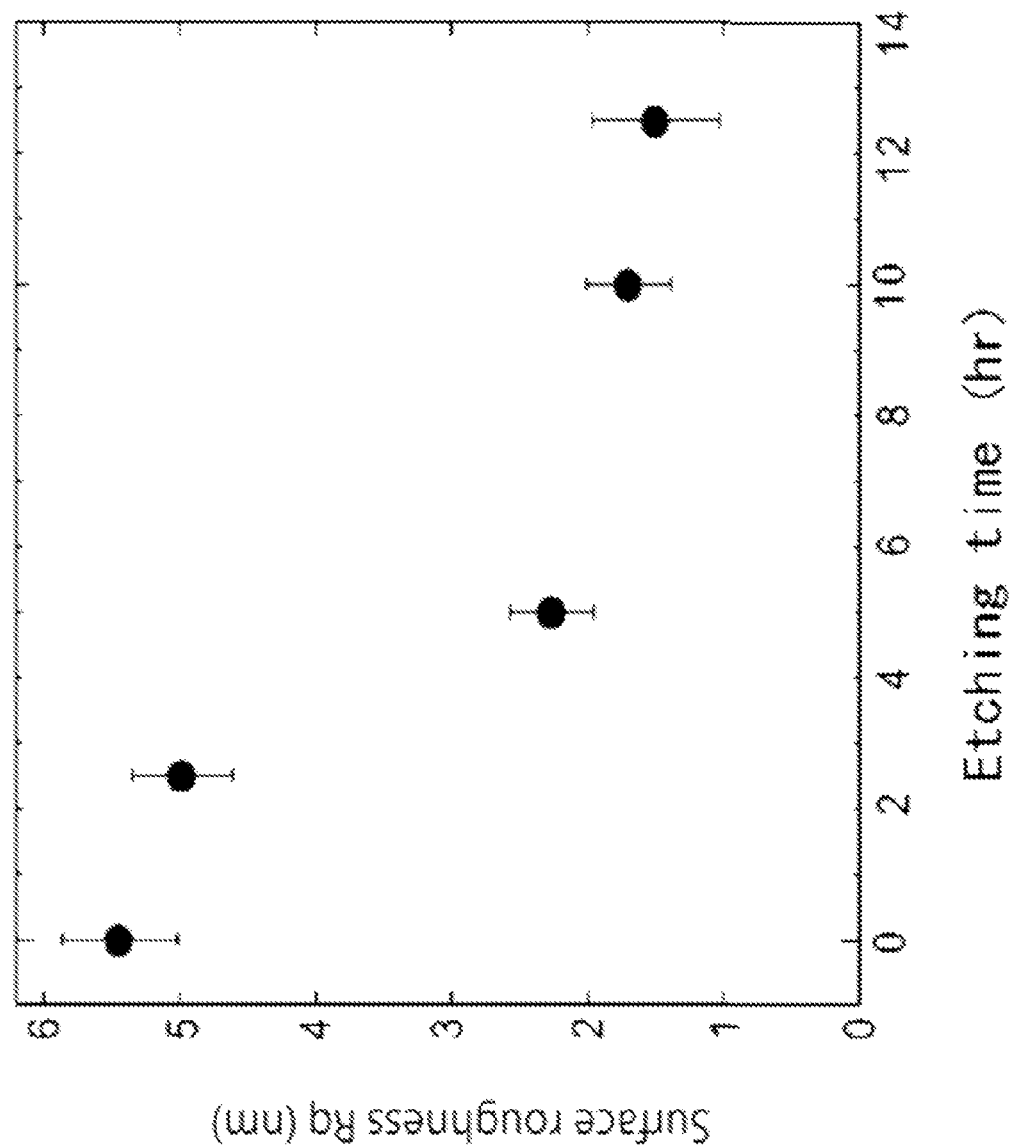
FIG. 14 is a graph representing changes in surface roughness of a Cr sample after a predetermined time period of etching with ozone water.

In order to examine the surface smoothing effect, the dependence of surface roughness on etching time was examined by using Cr samples. The samples were etched with the etchant used in Comparative Example 2 to prepare Cr samples with a coarse surface (Rq=about 5.4 nm). Each sample was etched with ozone water that had a temperature of 55° C. and a dissolved ozone concentration of 1.62 mg/L, and the smoothing process of the surface was evaluated by AFM over the course of etching. FIG. 14 is a graph representing changes in surface roughness by etching after a predetermined time period. Each point in graph represents the mean value of 5 samples. FIG. 15 represents AFM images at an arbitrary location of each sample after a predetermined time period.

As can be seen, the Cr film that had an average surface roughness Rq of 5.4 nm in the initial state had an average surface roughness Rq of about 1.5 nm after 12.5 hours. As clearly shown in the AFM images of FIG. 15, the surface projections become smaller, and the surface becomes smoother over Apparently, this is the result of the sharp, smaller curvature portions of the metal surface with a higher surface area/volume ratio being etched earlier than other portions.

INDUSTRIAL APPLICABILITY

The invention enables etching or smoothing metal with ozone water alone, without using an environmentally harmful etchant, and has potential use in the environmentally friendly production of products such as semiconductor devices. The invention also enables etching or smoothing metal at an atomic level. The invention is therefore useful for the atomic-level production of devices, and has potential use in the production of various metallic components and materials in a wide range of fields, including, for example, automobiles, medical equipment, electrics and electronics, solar cells, fuel cells, human body replacement parts (such as artificial joints), and semiconductors.

The invention claimed is:

1. A patterning method comprising the step of patterning a surface by etching with ozone water of solely ozone dissolved in water, wherein
    the etching is performed after Ti is provided on a metal or metal oxide that is etchable with the ozone water at an etching temperature of 20 to 60° C., and
    the metal or the metal oxide is ionized either directly or via an intermediate in the ozone water at a pH of 4.3 to 4.4, and an oxidation-reduction potential of +2.07 V.

2. The patterning method according to claim 1, wherein the etching involves ultrasonic vibration and/or ultraviolet irradiation.

3. A patterning method comprising the step of patterning a surface by etching with ozone water of solely ozone dissolved in water, wherein
    the etching is performed after Ti is provided on a metal or metal oxide that is etchable with the ozone water at an etching temperature of 20 to 60° C., and the metal or the metal oxide is ionized either directly or via a hydroxide in the ozone water at a pH of 4.3 to 4.4, and an oxidation-reduction potential of +2.07 V.

4. The patterning method according to claim 3, wherein the etching involves ultrasonic vibration and/or ultraviolet irradiation.

5. A patterning method comprising the step of patterning a surface by etching with ozone water of solely ozone dissolved in water, wherein
- the etching is performed after Ti is provided on a metal or metal oxide that is etchable with the ozone water at an etching temperature of 20 to 60° C., and
- the metal or the metal oxide is ionized either directly or via an oxide in the ozone water at a pH of 4.3 to 4.4, and an oxidation-reduction potential of +2.07 V.

6. The patterning method according to claim 5, wherein the etching involves ultrasonic vibration and/or ultraviolet irradiation.

\* \* \* \* \*